(12) United States Patent
Pawlak

(10) Patent No.: US 10,340,290 B2
(45) Date of Patent: Jul. 2, 2019

(54) STACKED SOI SEMICONDUCTOR DEVICES WITH BACK BIAS MECHANISM

(71) Applicant: GLOBALFOUNDRIES Inc., Grand Cayman (KY)

(72) Inventor: Bartlomiej Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/706,048

(22) Filed: Sep. 15, 2017

(65) Prior Publication Data

US 2019/0088680 A1 Mar. 21, 2019

(51) Int. Cl.
| H01L 27/01 | (2006.01) |
| H01L 27/12 | (2006.01) |
| H01L 29/06 | (2006.01) |
| H01L 21/84 | (2006.01) |
| H01L 21/822 | (2006.01) |
| H01L 27/06 | (2006.01) |

(52) U.S. Cl.
CPC .......... *H01L 27/1203* (2013.01); *H01L 21/84* (2013.01); *H01L 29/0649* (2013.01); *H01L 21/8221* (2013.01); *H01L 27/0688* (2013.01)

(58) Field of Classification Search
CPC ............................ H01L 27/1203; H01L 21/84; H01L 29/0649
USPC .......................................................... 257/348
See application file for complete search history.

(56) References Cited

U.S. PATENT DOCUMENTS

| 7,821,066 B2 | 10/2010 | Lebby et al. | |
| 7,960,248 B2 | 6/2011 | Di Cioccia | |
| 2004/0144979 A1* | 7/2004 | Bhattacharyya | ........ H01L 21/84 257/67 |
| 2005/0023525 A1* | 2/2005 | Ishikawa | ............... G02F 1/1368 257/59 |
| 2007/0181953 A1* | 8/2007 | Lyu | ..................... H01L 21/8221 257/382 |
| 2013/0089978 A1 | 4/2013 | Noel et al. | |

FOREIGN PATENT DOCUMENTS

EP 0843344 A1 5/1998

* cited by examiner

*Primary Examiner* — Theresa T Doan
(74) *Attorney, Agent, or Firm* — Amerson Law Firm, PLLC

(57) ABSTRACT

A semiconductor device includes at least two stacked SOI levels or configurations, each of which may include transistor elements formed on the basis of a given technology node. At least the uppermost device level may include a back bias mechanism for providing superior controllability of the respective transistor elements. In some illustrative embodiments, at least two of the stacked SOI configurations may have implemented therein a back bias mechanism, wherein an appropriate contact regime is provided so as to connect to the respective conductive regions or layers below the corresponding buried insulating layers for each stacked device level. Consequently, increased lateral packing density may be accomplished on the basis of a given technology node.

20 Claims, 7 Drawing Sheets

STACKED SOI SEMICONDUCTOR DEVICES WITH BACK BIAS MECHANISM

BACKGROUND

1. Field of the Disclosure

Generally, the present disclosure relates to the field of semiconductor devices formed on the basis of integration schemes that provide increased overall packing density.

2. Description of the Related Art

Significant progress has been made over the past decades in the field of semiconductor devices by continuously reducing critical dimensions of the individual circuit elements, such as field effect transistors and the like. Basically, reducing the overall lateral dimensions of transistors and other circuit elements has resulted in an enormous packing density in complex semiconductor devices, wherein several hundred millions of individual transistor elements may be provided in a single semiconductor chip representing a complex central processing unit. Implementing reduced lateral dimensions increases the packing density, in particular, in critical device regions, such as static and dynamic RAM (random access memory) regions, wherein a large number of transistor elements, possibly in combination with a storage capacitor, may have to be provided within restricted areas of the semiconductor device so as to provide high information density. This reduction in size has been accompanied by significant advantages with respect to transistor performance. As a typical example, the increased switching speed of transistors in critical signal paths may allow operation of control circuitry at significantly increased clock frequencies and, thus, increased operating speed.

Despite the many advantages associated with the continuous reduction of critical dimensions of semiconductor devices, however, a plurality of side effects accompanying these developments may have to be taken into account so as to not unduly offset the effects obtained by increasing operating speed and packing density. For example, upon continuously reducing the gate length of transistor elements, controllability of the corresponding channel of transistor elements may require significant efforts so as to provide the required functional behavior, even for highly sophisticated short channel transistors. In other aspects, overall parasitic capacitance in sophisticated transistor elements may contribute to a less than expected performance gain, as, for instance, a non-fully depleted channel region, in combination with the presence of a bulk region, may result in reduced operating speed of respective transistor elements, even if formed on the basis of extremely reduced vertical dimensions of 30 nm and even less. As a consequence, the increasing difficulties in providing sufficient channel controllability and non-negligible parasitic capacitance of the transistor body have driven respective developments in providing superior transistor configurations. For example, in some sophisticated approaches, "three-dimensional" transistor architectures may be used on the basis of respective semiconductor fins, which may have two or more surface areas that may be controlled by a surrounding gate electrode structure, thereby not only enhancing channel controllability, but also contributing to increased current drive capability. In other approaches, significant efforts have been made to provide sophisticated gate electrode structures on the basis of sophisticated material systems in order to achieve superior channel controllability, while still preserving the well-established planar transistor architecture.

Irrespective of the transistor architecture used, a so-called "SOI" (silicon- or semiconductor-on-insulator) architecture may be applied in an attempt to further reduce the parasitic capacitance of the transistor body or transistor channel, while also enhancing isolation of the transistor body from the surrounding device areas. In an SOI architecture, a buried insulating layer, for instance, comprising silicon dioxide, silicon nitride and the like, is typically formed below a respective semiconductor layer, such as a crystalline silicon layer, a crystalline silicon/germanium layer, a crystalline silicon/carbon layer and the like, in and above which a respective transistor element may be formed. Consequently, in addition to lateral isolation structures, such as shallow trench isolations, the buried insulating layer may result in a substantially complete insulation of respective transistor regions, thereby providing superior conditions during the operation of the transistor element.

As discussed above, the planar transistor architecture is generally based on well-established technical concepts that have been proven highly efficient over the past decades. Therefore, appropriate strategies have been developed which may be further adapted to strategies requiring even further reduced critical dimensions. On the other hand, the implementation of three-dimensional transistor architectures is accompanied by a plurality of sophisticated processes, which may significantly contribute to the overall manufacturing costs.

For these reasons, the concept of a planar transistor architecture has been further developed in view of overcoming many of the technical problems involved in the further reduction of critical dimensions of planar SOI transistor elements. As discussed above, highly complex gate electrode structures may be typically used for obtaining the desired channel controllability, which, however, may still require additional measures so as to allow a further reduction of respective channel lengths. One mechanism in this respect may provide superior controllability of basic transistor parameters, such as threshold voltage and the like, in combination with superior channel controllability, wherein an additional control voltage may be applied to a conductive region positioned below the buried insulating layer and, thus, enabling influence on charge carriers in the semiconductor layer across the buried insulating layer. A corresponding additional control voltage may also be referred to as "back bias" and the corresponding concept will be referred to herein as "back bias mechanism." That is, taking advantage of the SOI architecture, the buried insulating layer may be considered as a dielectric barrier, which, nevertheless, may still provide the possibility of establishing certain electrostatic influence on charge carriers in the channel region by providing an appropriately doped semiconductor region below the buried insulating layer, which may be additionally connected to an appropriate reference voltage source so as to provide an additional control voltage "on demand." Consequently, superior static and dynamic behavior of field effect transistors based on an SOI architecture may be achieved by using the back bias mechanism.

Moreover, in a further attempt to enhance overall transistor performance, a fully depleted transistor configuration may be established. This is typically accomplished by reducing a respective thickness of at least the channel region of transistor elements, so that, in a certain state of the transistor element, the respective channel region may be substantially fully depleted with respect to the majority charge carrier.

Although the concept of a fully depleted SOI transistor provides significant performance gain and, thus, allows the configuration of highly complex semiconductor devices, including a large number of transistor elements, it turns out, however, that further reduction of critical dimensions in the area of 30 nm and less may result in significant technical problems that may have to be overcome when striving to further enhance overall packing density of highly complex semiconductor devices. While, on the other hand, a corresponding increase of packing density on the basis of three-dimensional transistor architectures may be associated with significant technical challenges, as well as with significant manufacturing costs, significant efforts have been made in order to mitigate at least some of the technical problems associated with further device scaling, in particular in planar technologies.

For example, U.S. Patent Publication No. 2013/0089978 discloses an integrated circuit formed on the basis of transistor elements based on fully depleted SOI architecture, in which a common well region, i.e., a doped region formed below the buried insulating layer, may be used for a P-type transistor and an N-type transistor, wherein the commonly used well region may be used for biasing inversely doped back bias regions of the respective complementary transistors.

In other approaches as, for instance, disclosed in U.S. Pat. No. 7,821,066, the buried insulating layer may be provided as a multi-layered component, thereby specifically designing the characteristics of the buried insulating layer. EP 0843344 B1 discloses a process for transferring a semiconductor layer by using well-established SOI techniques. Similarly, U.S. Pat. No. 7,960,248 discloses a method for transferring a thin layer.

Although the technical approaches disclosed in these prior art documents may aim at enhancing transistor performance based on well-established fully depleted SOI architectures and/or increasing overall packing density, for instance, by contemplating the transfer of semiconductor layers for providing the possibility of forming stacked device configurations, it turns out, however, that these approaches are less than desirable in view of appropriately enhancing packing density while preserving superior transistor controllability, for instance, by using a back bias mechanism.

In view of the situation described above, the present disclosure relates, therefore, to semiconductor devices and manufacturing techniques in which the packing density may be increased, while preserving well-established control mechanisms, such as a back bias mechanism, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that a stacked SOI architecture may be used, in illustrative embodiments based on a fully depleted transistor configuration, wherein at least two stacked device levels may be implemented, wherein at least the upper SOI device level may have implemented therein a back bias mechanism for providing superior transistor performance. In illustrative embodiments, the back bias mechanism may also be implemented in at least one further SOI device level, thereby contributing to superior transistor performance in at least two stacked SOI device levels and enabling the implementation of well-established planar transistor configurations, while, at the same time, significantly increasing the overall packing density.

One illustrative embodiment disclosed herein relates to a semiconductor device which includes a first semiconductor layer formed on a first buried insulating layer. The semiconductor device further includes a first circuit element formed in and above the first semiconductor layer. Moreover, a conductive layer is formed above the first circuit element and a second buried insulating layer is formed on the conductive layer. Additionally, the semiconductor device includes a second semiconductor layer formed on the second buried insulating layer.

A further illustrative embodiment disclosed herein relates to a semiconductor device. The semiconductor device includes a first device region comprising a first semiconductor region formed on a first buried insulating layer that, in turn, is formed on a first back bias region. The semiconductor device further includes a second device region comprising a second semiconductor region formed on a second buried insulating layer that is formed on a second back bias region, wherein the first and second device regions form a stacked device configuration.

A still further illustrative embodiment disclosed herein relates to a method which includes forming a circuit element in and above a first semiconductor layer that is formed on a first buried insulating layer. The method additionally includes forming a layer stack above the first circuit element, wherein the layer stack comprises a conductive layer, a second buried insulating layer and a second semiconductor layer. The conductive layer is positioned next to the circuit element.

BRIEF DESCRIPTION OF THE DRAWINGS

The disclosure may be understood by reference to the following description taken in conjunction with the accompanying drawings, in which like reference numerals identify like elements, and in which.

Figure 1:
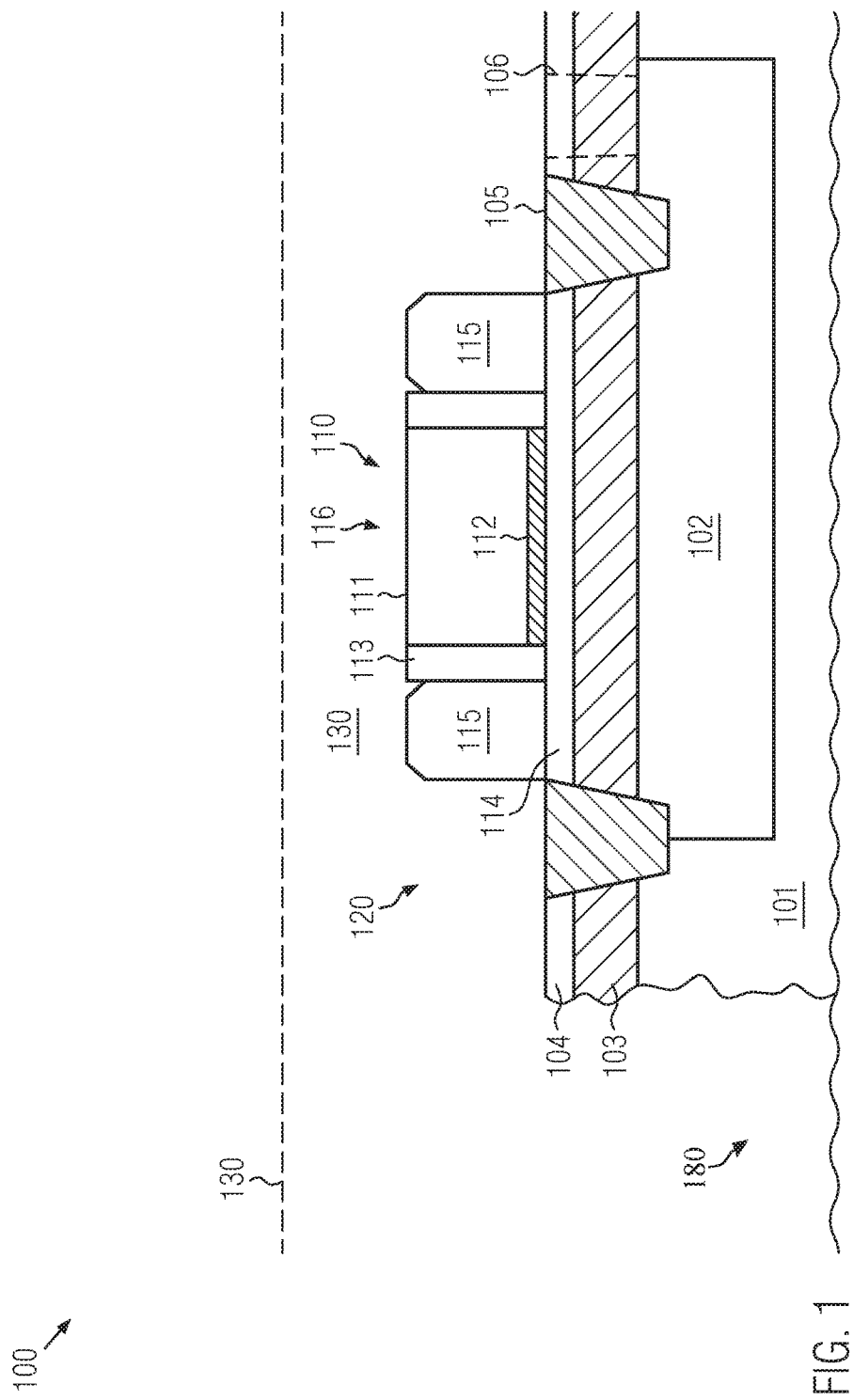
FIG. 1 schematically illustrates a cross-sectional view of a semiconductor device during a manufacturing stage in which a first circuit element, such as a transistor element, may be formed in accordance with an SOI configuration and, in some illustrative embodiments, using a back bias mechanism.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As discussed above, the present disclosure is based on the technical concept that well-established SOI architectures, in particular, for fully depleted transistor elements, may be used in sophisticated semiconductor devices on the basis of a stacked configuration, i.e., on the basis of a device configuration obtained by stacking at least two SOI device levels on top of each other, thereby preserving the advantages associated with an SOI architecture, while still resulting in significantly increased packing density for a given chip area, even for critical dimensions that are well within the technical scope of well-established process technologies.

Moreover, at least the upper most of the SOI device levels may be equipped with a back bias mechanism, i.e., with an appropriate conductive material layer positioned below at least the channel region of the respective transistor element, thereby guaranteeing superior controllability and, thus, performance of the respective transistor element. In some illustrative embodiments, the back bias mechanism may be provided in at least two stacked SOI configurations, thereby providing superior transistor performance in any of these stacked configurations. As a consequence, in such embodiments, a first configuration may be formed on the basis of well-established process techniques, while, additionally, any further circuit elements may be implemented in deeper lying device areas, such as non-SOI circuit elements in the form of transistors, body diodes and the like, as is well known in the art. On the other hand, respective device areas requiring the formation of sophisticated transistor elements based on a back bias mechanism may be implemented in the first configuration and specific modifications with respect to position, size and local interconnect structure may be appropriately adapted so as to allow proper connection of the circuit elements of the first configuration after having implemented a second SOI configuration stacked upon the first configuration, which may also be adapted with respect to position, size and interconnect structure so that, in total, significant increase of lateral packing density may be achieved, even if certain device areas may have to be designed so as to provide an increased area for establishing the respective interconnection and contact structure. In further illustrative embodiments, in addition to the first and second SOI configurations or levels, one or more additional stacked SOI configurations may be implemented, if considered appropriate for enhancing overall packing density, without requiring a reduction in size of critical device dimensions.

The stacking of two or more SOI configurations may be achieved by well-established wafer bond techniques after having implemented one or more SOI configurations in a first carrier substrate, wherein a respective conductive layer for providing a further back bias mechanism may be formed on the initial carrier substrate on the basis of any appropriate material, such as doped semiconductor material, metal-containing materials, such as a metal silicide material, tungsten-containing material and the like, while, in other cases, a corresponding conductive layer may be formed on a further donor substrate, which may also have formed thereon a further crystalline semiconductor material of appropriate thickness, which may then be transferred to the carrier substrate having formed therein one or more stacked SOI configurations.

FIG. 1 schematically illustrates a cross-sectional view of a semiconductor device 100 in an intermediate manufacturing stage, in which a plurality of circuit elements may be formed in and above a substrate 101, which may represent any appropriate carrier material, such as a crystalline semiconductor material, a dielectric material having formed thereon a moderately thick semiconductor material, and the like. In some illustrative embodiments, the semiconductor device 100 may comprise an SOI configuration 120, which may be understood as a device region including a buried insulating layer 103, for instance, formed of any appropriate dielectric material or materials, such as silicon dioxide, silicon nitride, nitrogen-containing silicon carbide, or other appropriate dielectric materials, such as high-k dielectric materials, and the like.

Furthermore, the SOI configuration or device region 120 may include a semiconductor layer 104, which may represent an appropriate base material for forming therein a channel region 114 of a transistor element 110. As discussed above, in some illustrative embodiments, the transistor element 110 may represent a sophisticated transistor element formed on the basis of critical dimensions of 30 nm, such as the gate length, and even less, so that a gate electrode structure formed of an electrode material 111, a gate dielectric material 112 and an appropriate sidewall spacer structure 113 may have a length, i.e., in FIG. 1, a horizontal extension of the gate electrode structure 116, of 30 nm and less. Furthermore, in this manufacturing stage, the transistor element 110 may include drain and source regions 115 formed in portions of the semiconductor layer 104 laterally adjacent to the channel region 114 and may have any appropriate configuration with respect to dopant profile as required by the overall design criteria. In the illustrative embodiment shown in FIG. 1, the drain and source regions 115 may be provided in the form of a raised drain and source architecture in which a highly doped semiconductor material may be formed on the initially provided semiconductor layer 104. It should be appreciated, however, that the principles disclosed herein may also be applied to any other planar circuit architecture, irrespective of the technology considered, wherein, however, the back bias mechanism is highly advantageous in fully depleted SOI transistor elements.

Furthermore, as already discussed above, in some sophisticated approaches, the channel region 114 may be provided as a fully depleted semiconductor region, which may be accomplished by selecting an appropriate thickness of the semiconductor layer 104, at least in the area of the channel region 114, wherein a respective thickness may be 15 nm and significantly less. Furthermore, the degree of doping, at least in a central area of the channel region 114, may include a moderately low dopant concentration or may represent a substantially intrinsic semiconductor material, such as a crystalline silicon material, a silicon/germanium material, a silicon/carbon material and the like, depending on the overall characteristics required by the transistor element 110 under consideration.

Furthermore, it should be appreciated that the gate electrode structure 116 may also have any appropriate configuration with respect to materials used therein for the various components 111 and 112, wherein, as discussed above, a highly complex configuration may be required in the form of a high-k dielectric material, a specific threshold-adjusting material layer in combination with an appropriate metal-containing barrier layer, and an appropriate electrode material. For convenience, any complex material systems are not explicitly shown in FIG. 1 and should be considered as being included in the materials 111 and 112, if such complex material systems may be required by the overall design criteria of the transistor element 110.

Furthermore, the transistor element 110 may be bordered in lateral directions by an appropriately designed isolation structure 105, such as a trench isolation, which may, thus, extend through the semiconductor layer 104 and to or into and through the buried insulating layer 103.

In some illustrative embodiments, the isolation structures 105 may have an appropriate depth and lateral size in order to appropriately border respective circuit elements, such as the transistor element 110, while, in other cases, the depth of the isolation structures 105, at least in some device regions, may be appropriately adapted so as to enable lateral delineation of deeper lying circuit elements, which may be formed in the substrate material 101. For instance, a corresponding device region 180 may be provided in cases when any non-SOI circuit elements, such as field effect transistors, body diodes, and the like, may have to be implemented in the semiconductor device 100.

Moreover, in some illustrative embodiments, a conductive region 102, for instance provided in the form of a doped portion of the substrate material 101, may be positioned at least below a portion of the channel region 114 in order to provide a respective back bias mechanism. That is, the doped region 102 is appropriately configured and positioned to allow electrostatic influence on at least a portion of the channel region 114 across the buried insulating layer 103, thereby providing superior transistor performance, as already discussed above. Since the doped region 102 may have to be connected to an appropriate reference voltage, a corresponding contact 106 may have been provided and may be configured to enable access to the doped semiconductor region 102, while, in other embodiments, a respective contact may be formed in a later manufacturing stage.

Furthermore, an appropriate material system 130 may be provided so as to encapsulate the circuit elements, such as the transistor elements 110 and possibly any circuit elements formed in other device regions, such as the device region 180. To this end, the material system 130 may include at least one or more dielectric materials, such as silicon dioxide, silicon nitride and the like, depending on the overall device requirements. Furthermore, the material system 130 may also reliably insulate and, thus, cover, any interconnect structures (not shown) which may have been formed in and above the semiconductor layer 104, for instance, in the form of conductive lines having a configuration similar to the gate electrode structure 116, in order to electrically connect respective circuit elements or portions thereof within the device level of the SOI configuration 120.

Moreover, it should be further appreciated that, in some illustrative embodiments, appropriate contact regions (not shown) in the form of metal-containing materials, such as nickel silicide, platinum silicide or any combination thereof, may be provided in various device regions, for instance, on top of the drain and source regions 115 and the gate electrode structure 116, thereby providing areas of reduced resistivity for being contacted in a later manufacturing stage. In other illustrative embodiments, any such contact regions of reduced resistivity may be formed in a later manufacturing stage when actually forming contact elements connecting circuit elements of the SOI configuration 120 with a corresponding metallization system still to be formed.

The semiconductor device 100 as illustrated in FIG. 1 may be formed on the basis of well-established process strategies in which the substrate 101 may be provided so as to include an initial version of the semiconductor layer 104 formed on the buried insulating layer 103. To this end, well-established SOI substrates may be available and may be used as an initial material for forming the semiconductor device 100 in accordance with the manufacturing stage as shown in FIG. 1. That is, in some illustrative embodiments, the transistor 110 may be formed in accordance with sophisticated process techniques, which may require preparation of the semiconductor layer 104 in terms of appropriate material composition, desired final layer thickness and the like, followed by a process sequence for forming the isolation structures 105 in accordance with device requirements. It should be appreciated that a corresponding design of the semiconductor device 100 may be appropriately adapted to the implementation of a further SOI configuration to be stacked upon the configuration 120 in a later manufacturing stage. That is, upon designing the SOI configuration 120, the spatial lateral relationship of contact elements and the like may have to be taken into consideration, in addition to the lateral positioning of any circuit elements and contact structures still to be formed in a later manufacturing stage.

Prior to or after forming the isolation structures 105, appropriate implantation processes may be performed so as to obtain the doped semiconductor region 102 that, in combination with appropriate contact elements, such as the element 106, may represent a back bias mechanism. Next, the gate electrode structure 116 may be formed by depositing appropriate materials and patterning the same on the basis of sophisticated process techniques. Thereafter, the drain and source regions 115 may be formed, for instance, by growing respective semiconductor materials with high internal dopant concentration, while, in other cases, respective drain and source regions may be formed on the basis of implantation processes and the like. Thereafter, if required, further processes may be applied so as to expose the electrode material 111 of the gate electrode structure 116, possibly in combination with process techniques for incorporating a metal silicide in exposed semiconductor-based portions of the device 110.

If required, the device region 180 may be exposed at any appropriate manufacturing stage in order to form therein respective circuit elements, such as body diodes, non-FET elements and the like, wherein, in some illustrative embodiments, a portion of the contact element 106 may also be formed by exposing a respective portion of the doped semiconductor region 102.

Thereafter, the material system 130 may be formed by appropriate deposition techniques, followed by a planarization so as to obtain a substantially planar surface topography.

Figure 2:
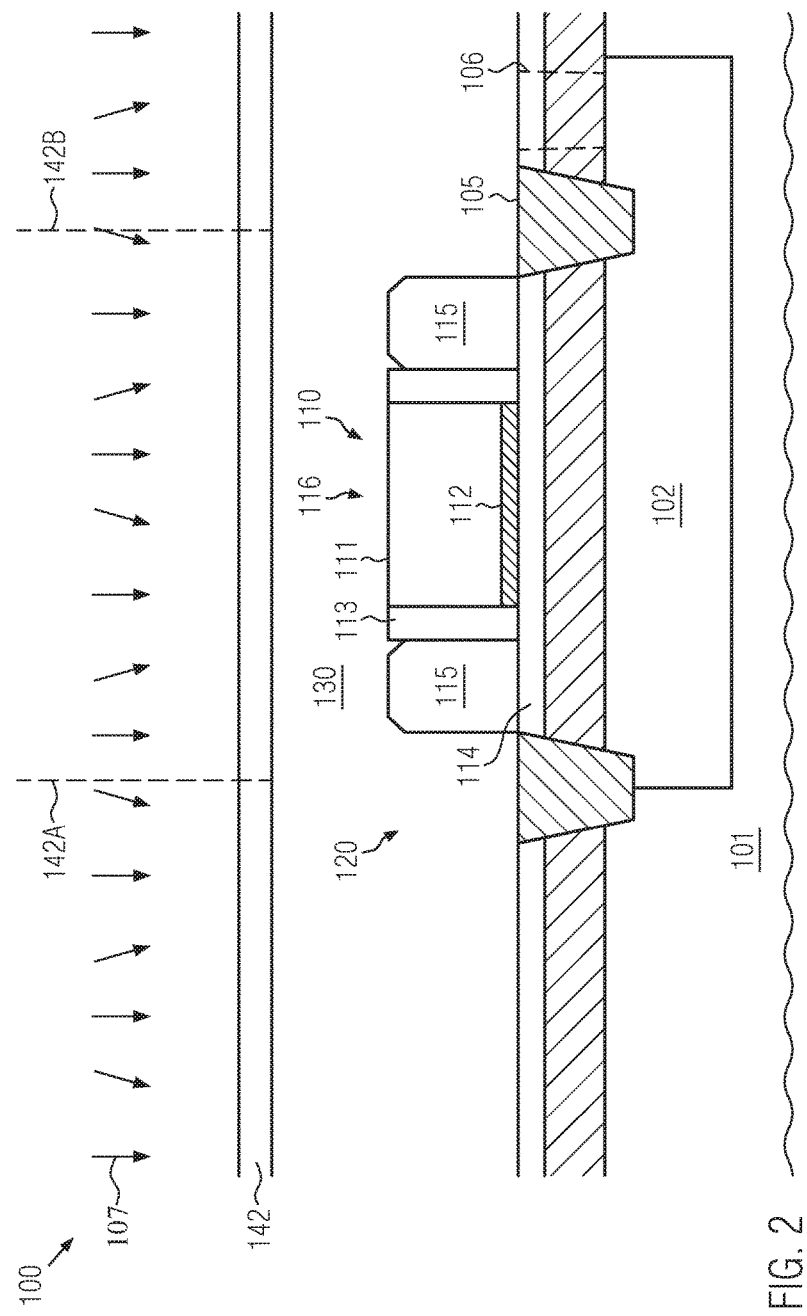
FIG. 2 schematically illustrates the semiconductor device of FIG. 1 in a further advanced manufacturing stage in which an encapsulating dielectric material and a conductive layer may be formed.

FIG. 2 schematically illustrates the semiconductor device 100 in a further advanced manufacturing stage. As illustrated, a conductive layer 142 may be formed on the material system 130, which may be accomplished on the basis of a process sequence 107. In some illustrative embodiments, the conductive layer 142, which may represent the conductive region for a back bias mechanism of a further SOI configuration still to be stacked on top of the SOI configuration 120, may be provided in the form of a metal layer, such as a tungsten layer and the like, or, in other embodiments, in the form of a metal-containing material layer, such as a metal silicide layer, including nickel, platinum or any combination thereof, while, in still other illustrative embodiments, the conductive layer 142 may be provided in the form of an appropriately doped semiconductor material. Consequently, during the process sequence 107, any appropriate base material may be deposited, for instance, in the form of amorphous silicon, germanium, or any appropriate material, which may be subsequently processed so as to exhibit a desired degree of conductivity. For instance, the layer 142 may be deposited as a doped semiconductor material or one or more dopant species may be incorporated by ion implantation and the like. Thereafter, a rapid thermal anneal treatment may be performed, wherein respective process parameters are selected so as to comply with the thermal budget of the previously established SOI configuration 120.

In other cases, a semiconductor material may be deposited, for instance, in the form of amorphous silicon, and thereafter, one or more appropriate metal components may be deposited and may be thermally treated so as to obtain a highly conductive metal silicide compound. In still other cases, appropriate metals, such as tungsten, may be deposited as the layer 142, without requiring significant additional post-deposition processing. In some illustrative embodiments, the process sequence 107 may include further respective patterning processes, such as lithography and etch sequences, when a lateral patterning of the layer 142 may be considered appropriate so as to provide lateral isolation of respective regions of the conductive layer 142, for instance, when respective back bias mechanisms may have to be provided on the basis of different reference voltages. For example, regions 142A, 142B may be removed by any appropriate patterning sequence, wherein the underlying material system 130 may act as an efficient etch-stop material.

Figure 3:
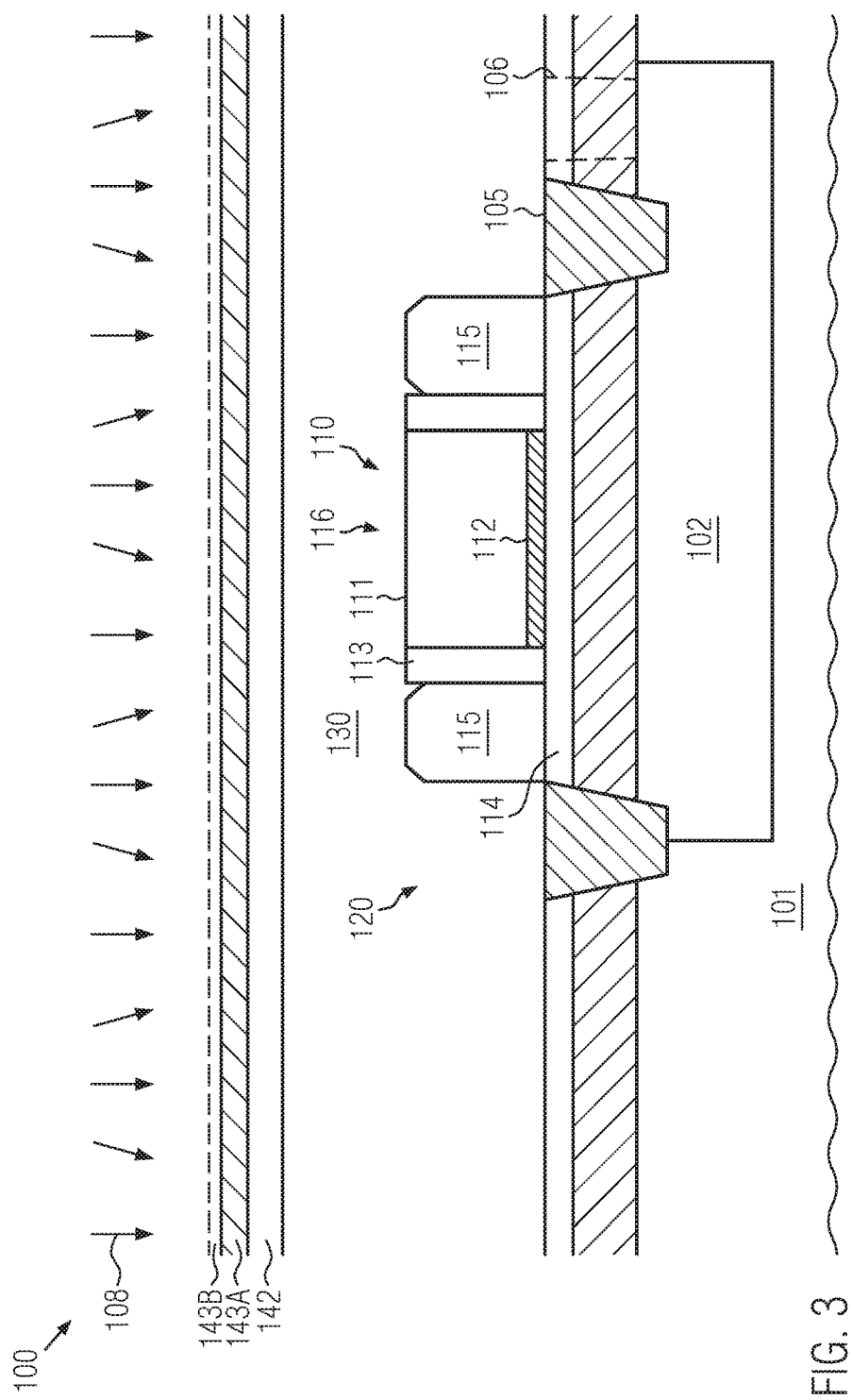
FIG. 3 schematically illustrates a cross-sectional view of the semiconductor device after forming a layer that may be used for founding a donor substrate and/or for becoming a further buried insulating layer or at least a portion thereof.

FIG. 3 schematically illustrates a cross-sectional view of the semiconductor device 100 in a further advanced manufacturing stage. As shown, one or more material layers 143A, 143B may be formed on the conductive layer 142, which may be accomplished on the basis of a respective process sequence 108, including well-established deposition techniques, possibly in combination with appropriate planarization processes, such as CMP (chemical mechanical polishing) and the like. The material 143A may act, in combination with another material layer, as a buried insulating layer of a further SOI configuration to be formed on top of the SOI configuration 120, possibly in combination with the material layer 143B, which may provide superior process conditions during a corresponding substrate bonding process, when, for instance, the material of the layer 143A itself may not appropriately provide respective adhesion and bonding characteristics.

For example, the layer 143A may be provided in the form of a silicon dioxide material with a thickness of approximately 10-20 nm, wherein such materials with the required thickness may be deposited, for instance, by plasma-enhanced CVD (chemical vapor deposition) techniques, thereby also complying with the thermal budget of the underlying circuit elements. It should be appreciated that, in embodiments in which the conductive layer 142 may have been patterned so as to provide laterally isolated islands, as discussed with reference to FIG. 2, the deposition of the material layer 143A may be accomplished so as to appropriately fill respective trench areas, while an appropriate planar surface topography may be accomplished by performing a planarization, for instance by CMP and the like. Thereafter, the process sequence 108 may comprise a further deposition process, if a specifically selected material composition may be considered appropriate for a later wafer bonding process. For example, the material 143B may comprise a compound of silicon, carbon, nitrogen, with a thickness of several nanometers.

In other illustrative embodiments, the material system 130 may have included therein, in an upper portion thereof, one or more materials that may be appropriate for serving as adhesion layers during a corresponding substrate bonding process. In this case, the conductive layer 142 may be omitted and one or both of the layers 143A, 143B may be provided as upper portions of the material system 130. In this case, the conductive layer 142 may be formed above a donor substrate and may be subsequently transferred to the semiconductor device 100 during the corresponding substrate bonding process.

Figure 4:
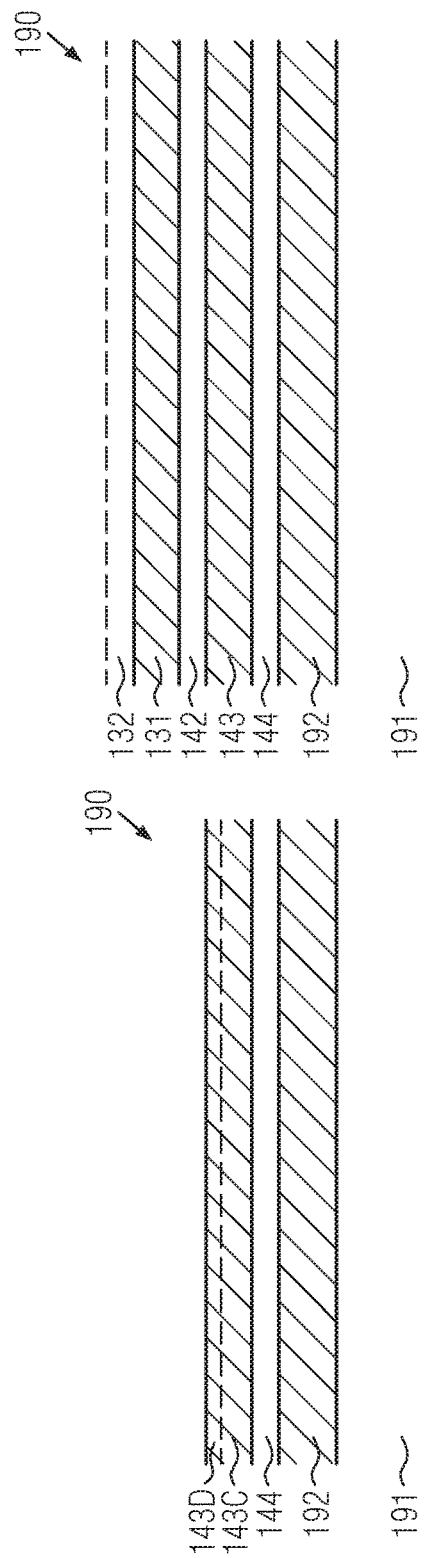
FIG. 4A schematically illustrates a substrate having formed thereon, at least locally, an SOI configuration, i.e., a buried insulating layer followed by a semiconductor layer, wherein a further dielectric may be additionally formed to be used as at least a portion of a further buried insulating layer and/or a layer for assisting in transferring the semiconductor layer to another substrate.
FIG. 4B schematically illustrates a donor substrate having formed thereon, at least locally, an SOI configuration, i.e., a buried insulating layer followed by a semiconductor layer, a buried insulating layer and/or a layer for assisting in transferring the semiconductor layer to another substrate in combination with a conductive layer that serves as a back bias layer after being transferred to another substrate.

FIG. 4A schematically illustrates a cross-sectional view of a donor substrate 190 comprising any appropriate carrier material 191, such as a silicon material, on which a plurality of material layers may be formed. For instance, a stop layer 192, such as a silicon dioxide material, a silicon nitride material and the like, may be provided with appropriate thickness, followed by a crystalline semiconductor layer 144, such as a crystalline silicon layer, a silicon/germanium layer, a germanium layer and the like, wherein an initial thickness is adjusted so as to comply with the requirements for sophisticated transistor elements to be formed in and above the semiconductor layer 144 in a later manufacturing stage.

As discussed above, in some illustrative embodiments, an initial thickness of the semiconductor layer 144 may be 15 nm and less in order to provide fully depleted transistor elements in a later manufacturing stage. It should be appreciated that the substrate material 191, the stop layer 192 and the semiconductor layer 144 may be initially provided in the form of an SOI substrate, wherein the stop layer 192 may represent the buried insulating layer. Moreover, a dielectric layer 143C, which may represent a portion of a buried insulating layer of a further SOI configuration, may be formed, possibly in combination with a surface layer 143D, that may exhibit the desired adhesion and bonding characteristics when the material 143C may be considered less appropriate for obtaining a desired bonding strength and the like. For example, the layer 143C may be provided in the form of silicon dioxide, silicon nitride and the like, while the layer 143D may be provided in the form of a compound including silicon, carbon, nitrogen and the like. It should be appreciated, however, that the layers 143C, 143D may be designed so as to comply with other device criteria, for instance, with respect to superior controllability and/or providing additional mechanisms, such as a ferroelectric effect and the like, so that one or both of these layers may also include a corresponding high-k dielectric material, which may be possibly formed so as to exhibit a ferroelectric phase.

The donor substrate 190 may be formed on the basis of well-established deposition techniques, for instance, starting from a well-known SOI substrate, including the materials 191, 192 and 144.

FIG. 4B schematically illustrates the donor substrate 190 according to other illustrative embodiments, in which not only a crystalline semiconductor layer and a portion of the buried insulating material may have to be transferred, but, additionally, a conductive material may be provided on the donor substrate 190, as already indicated above with reference to FIG. 3.

Consequently, the donor substrate 190 may comprise the carrier material 191, the stop material 192, followed by the semiconductor layer 144 having the desired characteristics, followed by a dielectric layer 143, which may serve as the buried insulating layer of a further SOI configuration in a later manufacturing stage. For example, the layer 143 may comprise silicon dioxide, silicon nitride, high-k dielectric materials and the like, as discussed above. Next, the conductive layer 142 having characteristics as previously discussed with reference to FIG. 2, may be provided, followed by one or more material layers 131, 132, which may be appropriately designed so as to serve as appropriate adhesion layers and also complement the dielectric material system 130 (see FIG. 3) after having attached the donor substrate 190 to the semiconductor device 100 of FIG. 3. For example, the one or more materials 131, 132 may be provided in the form of silicon dioxide, silicon nitride, a silicon/carbon/nitrogen compound and the like.

The donor substrate 190 may be formed on the basis of well-established deposition techniques, starting from an initial SOI substrate including the materials 191, 192 and 144.

Figure 5:
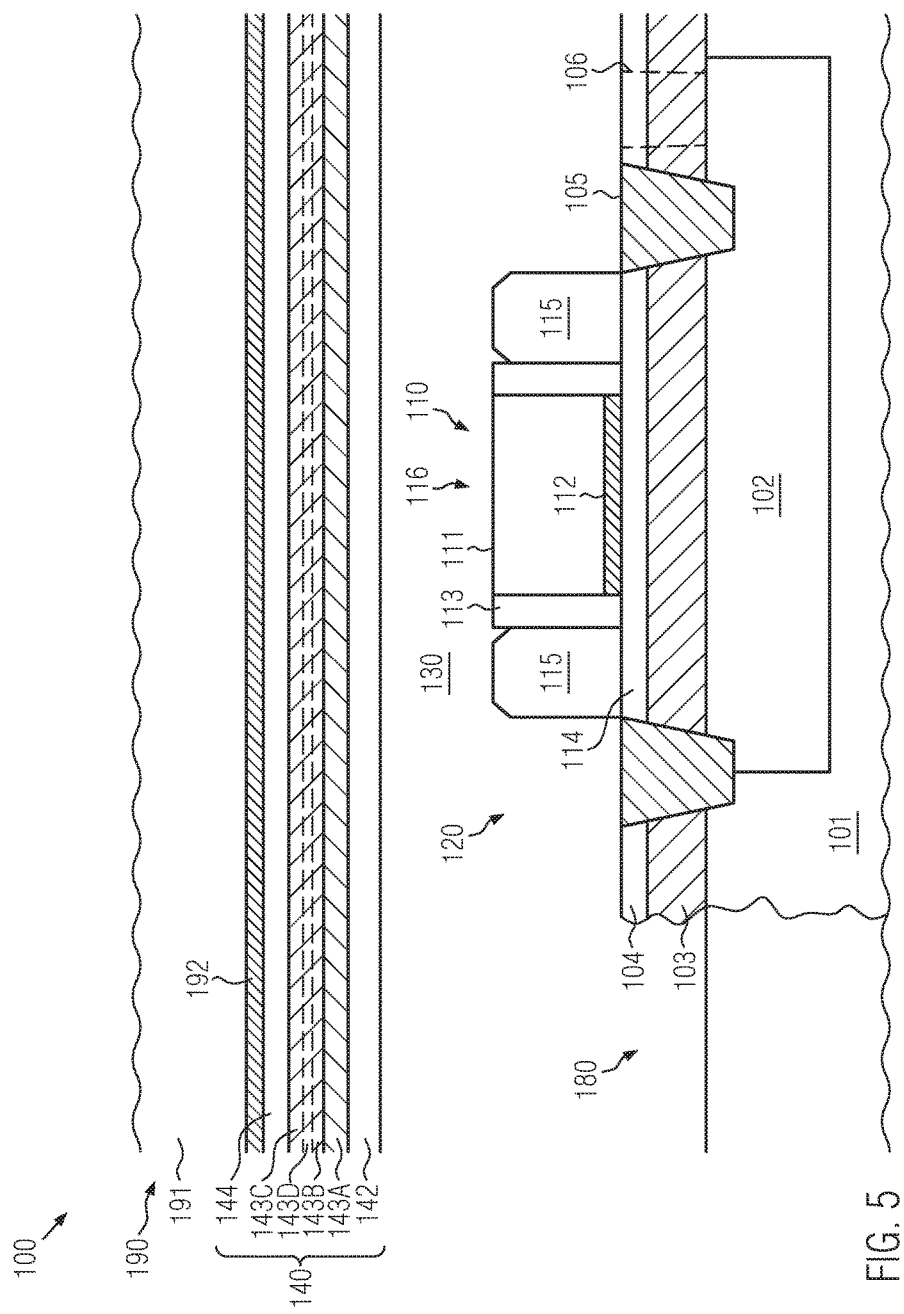
FIG. 5 schematically illustrates a cross-sectional view of a composite device comprising the semiconductor device as shown in FIG. 3 and the device as shown in FIG. 4 in a stacked configuration.

FIG. 5 schematically illustrates the semiconductor device 100 in a manufacturing stage in which the donor substrate 190 may be attached to the semiconductor device 100 so that the respective material layers 143D and 143B, if provided, are in direct contact with each other, thereby resulting in desired adhesion upon applying heat and pressure to the substrate 190 and the device 100. In other cases, when these optional layers 143D, 143B are not required, the corresponding materials 143C and 143A may be in direct contact and may adhere to each other due to the application of heat and pressure.

It should be appreciated that FIG. 5 schematically illustrates the donor substrate 190 according to the embodiment as described with reference to FIG. 4A, wherein the conductive layer 142 may be provided on top of the material system 130. In other illustrative embodiments (not shown), the donor substrate 190 according to FIG. 4B may be attached to the semiconductor device 100. In this case, the optional layer 132 or the layer 131 may come into contact with the material system 130 and may, thus, represent a portion of the material system 130 after bonding the substrate 190 to the semiconductor device 100. In this case, the conductive layer 142 would be transferred to the semiconductor device 100 together with the layer 143, representing the buried insulating material of the semiconductor layer 144.

Irrespective of the configuration of the donor substrate 190, a corresponding SOI configuration 140 may, thus, be formed on top of the previously formed SOI configuration 120 and may comprise the conductive layer 142 acting as a back bias material layer, followed by a buried insulating layer 143 for the alternative as discussed with reference to FIG. 4B, while, in other cases, the buried insulating layer may comprise two or more layers, such as the layers 143A, 143B, 143D, 143C, followed by the semiconductor layer 144, which is still covered by the stop material 192.

After having bonded the donor substrate 190 and the semiconductor device 100, the further processing may be continued by well-established process strategies, such as a process for trimming edge regions (not shown) of the substrate compound, including the components 190 and 100, followed by a process sequence for removing the substrate material 191. To this end, grinding and etch techniques may be applied, wherein the stop material 192 may guarantee a reliable stop of the corresponding processes in order to ensure integrity of the semiconductor layer 144. Thereafter, the stop material 192 may be removed, for instance, by highly selective etch recipes, such as wet chemical etch recipes, in which, for instance, silicon dioxide may be removed in a highly selective manner with respect to a silicon material, without unduly removing material of the layer 144. Consequently, after the above-described process sequence, the semiconductor device 100 may comprise the SOI configuration 140 stacked above the configuration 120 and including the potential for implementing a further back bias mechanism based on the conductive layer 142.

Figure 6:
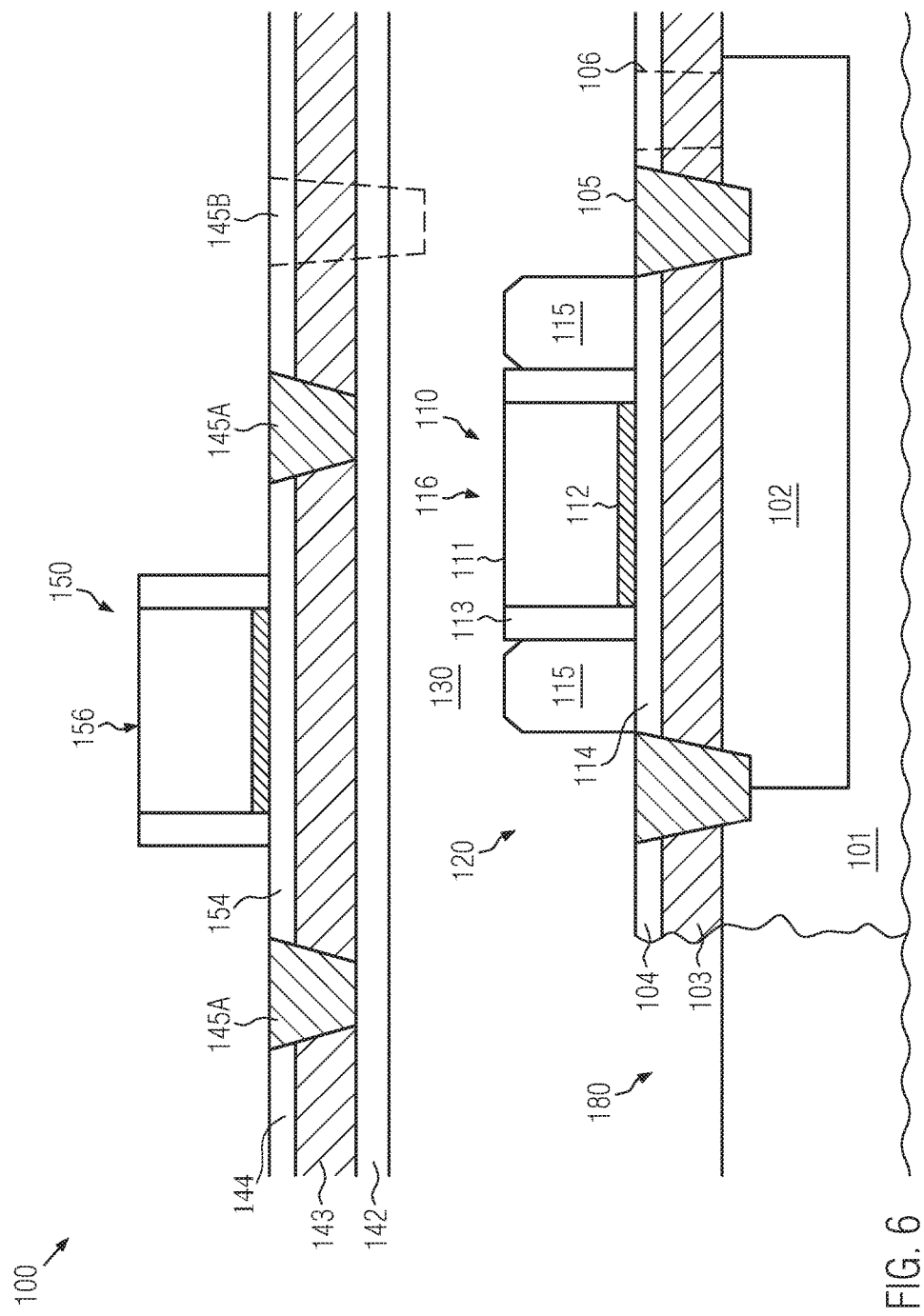
FIG. 6 schematically illustrates the semiconductor device in a further advanced manufacturing stage in which a further circuit element may be formed on the basis of a further SOI configuration obtained on the basis of the stacked configuration as shown in FIG. 5.

FIG. 6 schematically illustrates a cross-sectional view of the semiconductor device 100 in a further advanced manufacturing stage. As illustrated, a transistor element 150 may be formed in the SOI configuration 140 on the basis of any appropriate device architecture which may be similar to the device architecture of the transistor element 110 or which may be different, depending on the overall device requirements. It should be noted that the back bias mechanism is particularly effective for field effect transistors having planar geometry, i.e., having a gate electrode structure forming a substantially planar interface with a channel region without wrapped around electrode portions and thus a folded channel region is as the case in 3-dimensional transistors.

In the manufacturing stage shown, the transistor element 150 may comprise a gate electrode structure 156 of any appropriate dimension and configuration with respect to material systems implemented therein in order to provide the desired controllability of a channel region 154 that is formed as a part of the initial semiconductor layer 144. As discussed above, in some illustrative embodiments, the channel region 154, or at least a central area thereof, may be designed as a fully depleted semiconductor region, thereby requiring a thickness of 15 nm or significantly less. It should be appreciated that the respective drain and source regions may be formed in a further advanced manufacturing stage, for instance, based on a raised drain and source architecture, as is also discussed above with reference to the transistor element 110. Furthermore, isolation structures 145A may be provided so as to laterally border respective device regions, such as the region of the transistor element 150. In some illustrative embodiments, the isolation structures 145A may extend to and possibly into the conductive layer 142, however, without interrupting the layer 142, if a lateral conductivity beyond the respective isolation structures 145A may be required. In other cases, in addition to the isolation structures 145A, further isolation structures 145B may be provided so as to extend through the conductive layer 142 when a lateral patterning of the conductivity thereof is required. As previously discussed with reference to FIG. 2, a corresponding lateral patterning of the conductive layer 142 may also be accomplished in an earlier manufacturing stage, if considered appropriate.

It should be appreciated that respective process techniques used for forming the semiconductor device 100 in the stage shown in FIG. 6 may be based on well-established process techniques, for instance, for defining the required material characteristics of the semiconductor layer 144, forming the isolation structures 145A, possibly in combination with the isolation structures 145B, and providing the gate electrode structure 156. Moreover, as also discussed above, the general design of the semiconductor device 100 in the second SOI configuration 140 may be appropriately adapted so as to allow a subsequent electrical connection to the circuit elements provided in the SOI configuration 120 and possibly in the device region 180 and also appropriately connect to any circuit elements, such as the transistor 150, in the stacked SOI configuration 140. Moreover, a respective contact with the conductive layer 142 and the doped semiconductor region 102 may have to be provided so as to obtain the respective back bias mechanisms for the transistors 150 and 110.

Figure 7:
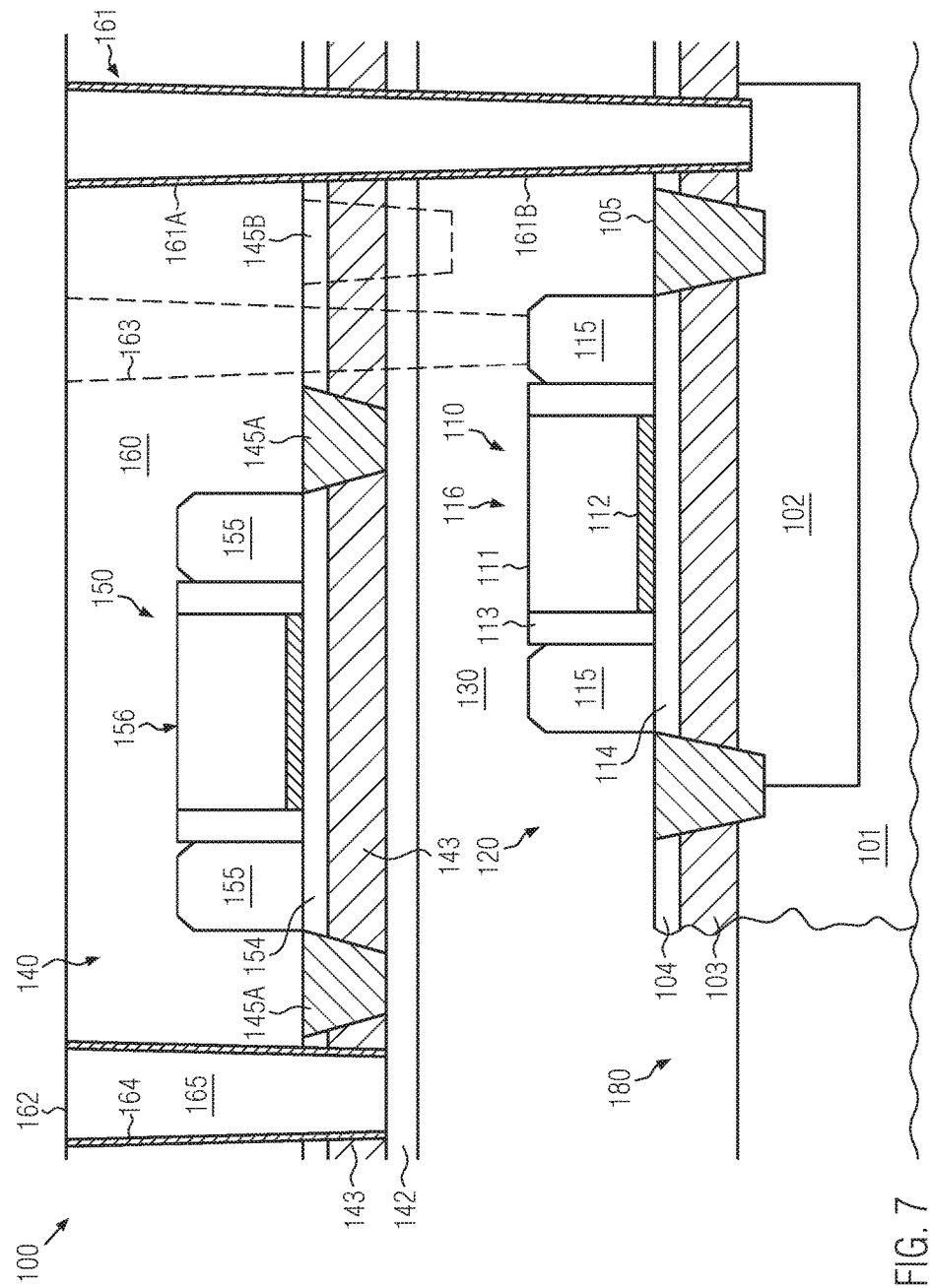
FIG. 7 schematically illustrates the semiconductor device in a further advanced manufacturing stage with two stacked SOI configurations, each comprising a respective circuit element and a back bias mechanism according to illustrative embodiments.

FIG. 7 schematically illustrates a cross-sectional view of the semiconductor device 100 in a further advanced manufacturing stage. As shown, the transistor element 150 may be completed, for instance, by forming respective drain and source regions 155, which may be provided in the form of a raised drain and source architecture, as discussed above. Furthermore, it should be appreciated that the drain and source regions 155 and, possibly the gate electrode structure 156, may have formed therein highly conductive contact regions (not shown), such as metal silicide compounds and the like, in order to reduce contact resistance in these components upon forming contact elements connecting to one or more of these components.

Furthermore, a dielectric material system 160 may be provided so as to encapsulate the transistor element 150, as also previously discussed in the context of the material system 130. As a consequence, the stacked SOI configurations 120, 140 may have formed therein appropriately dimensioned and configured transistor elements 110, 150, respectively, thereby providing increased lateral packing density without requiring undue reduction of critical dimensions of the transistor elements 110, 150. In this manner, an increase of lateral packing density may be decoupled from the reduction of lateral transistor dimensions. Furthermore, for both SOI configurations or semiconductor regions 120, 140, well-established process techniques may be sequentially applied with an intermediate substrate bonding process sequence, so that respective process sequences may be repeatedly applied substantially without requiring significant modifications. Therefore, respective complex process adaptations, which are typically associated with the reduction of critical dimensions, may not be necessary.

Moreover, after forming the dielectric material system 160, respective contact elements may be formed in accordance with process techniques that may take into account the respective lateral device design so as to establish the required electrical connections to the transistor element 110 and the transistor element 150. In some illustrative embodiments, at least a contact element 161 may be formed so as to extend through the upper SOI region or configuration 140 so as to finally connect to the doped semiconductor region 102, thereby providing the respective back bias mechanism for the transistor 110. Similarly, a contact element 162 may be formed so as to connect to the connective layer 142, thereby providing the back bias mechanism for the transistor element 150.

The contact elements 161, 162 may be formed on the basis of well-established process strategies in which respective openings may be formed so as to extend through the dielectric material system 160 and to a respective contact portion (not shown), which may have been formed in an earlier manufacturing stage. In other cases, the process sequence for forming the respective openings may be applied such that the openings may also extend through the buried insulating layer 143 and to or into the conductive layer 142 for the contact element 162. Since only well-known materials may have to be etched during the corresponding process sequence, respective minor adjustments of the etch process may be achieved on the basis of well-established etch techniques. For example, if different patterning processes may have to be applied, respective etch masks (not shown) may be formed so as to mask respective device regions, while enabling the patterning of respective openings in other device regions. In other cases, the contact element 161 may be formed on the basis of two or more individual contact portions, indicated as 161B, 161A, wherein the portion 161B may be formed in an early manufacturing stage prior to establishing the SOI configuration 140. To this end, the material system 130 may be appropriately patterned so as to receive respective openings connecting to contact areas of the transistor 110, if required, and, in particular, to connect to a contact portion (not shown) or directly to the doped semiconductor region 102. Thereafter, the respective openings may be coated by an appropriate dielectric material 164, followed by the deposition of any appropriate conductive material 165, such as tungsten and the like.

It should be noted that, in embodiments in which the contact portion 161B may be formed separately, contact portions for connecting to drain and/or source regions may also be formed prior to bonding the donor substrate 190 (see FIGS. 4A, 4B, 5) to the semiconductor device 100. In this case, the contact elements 161, 162 may be formed on the basis of a substantially similar process sequence in which the contact element 162 may be formed together with the upper portion 161A of the contact element 161 and any other contact elements that may have to establish contact of the transistor element 150 to any other circuit elements in the SOI configuration 140 that require connection via respective contact elements.

It should be appreciated that, in some illustrative embodiments (not shown), at least some of the contact elements 162 and/or 161 may be positioned so as to extend through respective isolation structures 105 and/or 145A, which, in turn, may have appropriate lateral dimensions so as to enable reliable alignment of such contact elements.

After having formed the required contact elements 161, 162, 163, the further processing may be continued by providing a further SOI configuration, such as the configuration 140, which may also be accomplished on the basis of wafer bond techniques. Irrespective of the number N of stacked SOI configurations, with N being 2, 3, 4, . . . , at least some of which may have a back bias mechanism, an appropriate metallization system may be formed so as to connect to the respective contact elements.

As a result, the present disclosure provides semiconductor devices and manufacturing techniques in which at least two stacked SOI configurations may be provided, wherein at least the upper SOI configuration may have implemented therein a back bias mechanism on the basis of a specifically designed conductive layer. In some illustrative embodiments, two stacked SOI configurations, and in other embodiments, all of the stacked SOI configurations, have implemented therein respective back bias mechanisms, thereby providing superior transistor controllability in each of the stacked SOI configurations. By appropriately amending the lateral design of the respective device levels, contact may be established with all of the stacked device levels on the basis of contact elements, while, nevertheless, providing significantly increased lateral packing density without requiring significant reduction of lateral dimensions. Therefore, well-established process techniques may be applied for forming the transistor elements in the individual SOI levels or configurations, while still preserving the advantages gained by a back bias mechanism. In this manner, further device scaling on the basis of sophisticated technologies may be accomplished, in particular, for SOI-based fully depleted transistor architectures, while mitigating many of the technological problems associated with further reduction of critical dimensions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
a first semiconductor layer formed on an upper surface of a first buried insulating layer;
a first circuit element formed in and above said first semiconductor layer, said first circuit element comprising drain and source regions that are formed at least partially in said first semiconductor layer;
a conductive layer formed above said first circuit element, wherein said conductive layer is electrically isolated from said drain and source regions that are formed at least partially in said first semiconductor layer;
a second buried insulating layer formed on an upper surface of said conductive layer; and
a second semiconductor layer formed on an upper surface of said second buried insulating layer.

2. The semiconductor device of claim 1, further comprising a second circuit element formed in and above said second semiconductor layer, wherein said conductive layer comprises a back bias mechanism that is adapted to control behavior of said second circuit element.

3. The semiconductor device of claim 1, wherein said conductive layer comprises a metal species.

4. The semiconductor device of claim 1, wherein said conductive layer comprises a doped semiconductor material.

5. The semiconductor device of claim 1, further comprising a conductive region positioned below said first buried insulating layer, said conductive region comprising a back bias mechanism that is adapted to control behavior of said first circuit element.

6. The semiconductor device of claim 5, further comprising a first contact element that extends from said second semiconductor layer to said conductive region.

7. The semiconductor device of claim 1, further comprising a second contact element that extends from said second semiconductor layer to said conductive layer.

8. The semiconductor device of claim 1, wherein at least one of said first and second semiconductor layers is provided with a layer thickness of 15 nm or less.

9. The semiconductor device of claim 8, wherein both said first semiconductor layer and said second semiconductor layer have said layer thickness of 15 nm or less.

10. The semiconductor device of claim 9, wherein said first semiconductor layer forms at least a portion of a first channel region of a first transistor element and said second semiconductor layer forms at least a portion of a second channel region of a second transistor element.

11. The semiconductor device of claim 10, wherein at least one of said first and second transistor elements is a fully depleted transistor element.

12. The semiconductor device of claim 1, further comprising:

a second conductive layer formed above said second semiconductor layer, wherein said second conductive layer is electrically isolated from said second semiconductor layer;

a third buried insulating layer formed above said second conductive layer; and a third semiconductor layer formed above said third buried insulating layer.

13. The semiconductor device of claim 1, wherein said drain and source regions comprise respective raised drain and source region portions.

14. A semiconductor device, comprising:

a first device region, said first device region comprising:

a first buried insulating layer that is formed on an upper surface of a first back bias region;

a first semiconductor region formed on an upper surface of said first buried insulating layer; and a first transistor element formed in said first semiconductor region and comprising first drain and source regions; and a second device region positioned above said first device region, said second device region comprising:

a second buried insulating layer that is formed on an upper surface of a second back bias region;

a second semiconductor region formed on an upper surface of said second buried insulating layer; and a second transistor element formed in said second semiconductor region and comprising second drain and source regions, said first and second device regions forming a stacked device configuration, wherein said second back bias region is electrically isolated from said first drain and source regions in said first semiconductor region.

15. The semiconductor device of claim 14, further comprising an intermediate dielectric material formed so as to separate said first and second device regions in a height direction of said semiconductor device.

16. The semiconductor device of claim 14, wherein at least one of said first transistor element and said second transistor element is a fully depleted transistor element.

17. The semiconductor device of claim 14, wherein said first back bias region is adapted to control behavior of a first transistor element that is formed in and above said first semiconductor region and wherein said second back bias region is adapted to control behavior of a second transistor element that is formed in and above said second semiconductor region.

18. The semiconductor device of claim 14, wherein at least one of said first and second drain and source regions comprise respective raised drain and source region portions.

19. A stacked SOI device, comprising:

a first SOI configuration, comprising:

a conductive region formed in a semiconductor substrate;

a first semiconductor layer positioned above said semiconductor substrate;

a first buried insulating layer positioned between said conductive region and said first semiconductor layer;

a first isolation structure positioned in at least said first semiconductor layer, said first isolation layer defining a first device region in said first semiconductor layer; and a first transistor element formed in and above said first device region;

a first insulating material system positioned above said first SOI configuration;

a first conductive contact extending through said first insulating material system and electrically coupled to said conductive region;

a second SOI configuration stacked above said first SOI configuration, said second SOI configuration comprising:

a conductive layer positioned above said first insulating material system, wherein said conductive layer is electrically isolated from said first device region;

a second semiconductor layer positioned above said conductive layer;

a second buried insulating layer positioned between said conductive layer and said second semiconductor layer;

a second isolation structure positioned in at least said second semiconductor layer, said second isolation structure defining a second device region in said second semiconductor layer; and a second transistor element formed in and above said second device region;

a second insulating material system positioned above said second SOI configuration; and a second conductive contact extending through said second insulating material system and electrically coupled to said conductive layer.

20. The stacked SOI device of claim 19, wherein said conductive region comprises a first back bias mechanism that is adapted to control behavior of said first transistor element and wherein said conductive layer comprises a second back bias mechanism that is adapted to control behavior of said second transistor element.

* * * * *